(12) United States Patent
Yamamoto et al.

(10) Patent No.: US 8,084,315 B2
(45) Date of Patent: Dec. 27, 2011

(54) METHOD OF FABRICATING NON-VOLATILE SEMICONDUCTOR MEMORY DEVICE BY USING PLASMA FILM-FORMING METHOD AND PLASMA NITRIDATION

(75) Inventors: Katsuhiko Yamamoto, Himi (JP); Tadashi Terasaki, Imizu (JP); Yoshiki Yonamoto, Oyama (JP); Hirotaka Hamamura, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/622,816

(22) Filed: Nov. 20, 2009

(65) Prior Publication Data

US 2010/0123183 A1    May 20, 2010

(30) Foreign Application Priority Data

Nov. 20, 2008   (JP) ................................. 2008-296309
Oct. 2, 2009    (JP) ................................. 2009-230759

(51) Int. Cl.
H01L 21/336   (2006.01)
H01L 21/8234  (2006.01)
H01L 21/8238  (2006.01)
H01L 29/792   (2006.01)

(52) U.S. Cl. ......... 438/211; 438/197; 438/199; 257/324

(58) Field of Classification Search ........................ None
See application file for complete search history.

(56) References Cited

U.S. PATENT DOCUMENTS 6,559,007 B1 *   5/2003   Weimer ........................ 438/257
7,419,918 B2 *   9/2008   Kim et al. ..................... 438/775
2006/0110939 A1 *  5/2006   Joshi et al. ................... 438/778
2006/0246661 A1 * 11/2006   Joo et al. ....................... 438/257
2007/0228453 A1   10/2007   Yamazaki et al.
2007/0298622 A1 * 12/2007   Terasaki et al. ............... 438/770
2008/0135922 A1 *  6/2008   Mitani et al. .................. 257/325

(Continued)

FOREIGN PATENT DOCUMENTS

JP          06-209009       7/1994

(Continued)

OTHER PUBLICATIONS

Japan Patent Office office action for patent application JP2009-230759 (Dec. 7, 2010).

(Continued)

Primary Examiner — N Drew Richards
Assistant Examiner — Michael Jung
(74) Attorney, Agent, or Firm — Kilpatrick Townsend & Stockton LLP

(57) ABSTRACT

A technique capable of improving the memory retention characteristics of a non-volatile memory is provided. In particular, a technique of fabricating a non-volatile semiconductor memory device is provided capable of enhancing the film quality of a silicon oxide film even when a silicon oxide film as a first potential barrier film is formed with a plasma oxidation method to improve the memory retention characteristics of the non-volatile memory. After a silicon oxide film, which is a main component of a first potential barrier film, is formed with a plasma oxidation method, plasma nitridation at a high temperature and a heat treatment in an atmosphere containing nitric oxide are performed in combination, thereby forming a silicon oxynitride film on the surface of the silicon oxide film, and segregating nitrogen to an interface between the silicon oxide film and a semiconductor substrate.

10 Claims, 9 Drawing Sheets

U.S. PATENT DOCUMENTS

2009/0032863 A1* 2/2009 Levy et al. .................... 257/324
2009/0239364 A1* 9/2009 Nishita et al. ................ 438/585

FOREIGN PATENT DOCUMENTS

| JP | 06-291330 | | 10/1994 |
|---|---|---|---|
| JP | 09-148325 | | 6/1997 |
| JP | 09-326478 | A | 12/1997 |
| JP | 2004-40064 | A | 2/2004 |
| JP | 2006-156626 | A | 6/2006 |
| JP | 2007-129240 | A | 5/2007 |
| JP | 2008-103666 | A | 5/2008 |
| KR | 1020060106255 | A | 11/2006 |

OTHER PUBLICATIONS

Korean Intellectual Property Office (KIPO) for KIPO patent application KR10-2009-0107677 (Apr. 4, 2011).

* cited by examiner

METHOD OF FABRICATING NON-VOLATILE SEMICONDUCTOR MEMORY DEVICE BY USING PLASMA FILM-FORMING METHOD AND PLASMA NITRIDATION

CROSS-REFERENCE TO RELATED APPLICATION

The present application claims priorities from Japanese Patent Application No. JP 2008-296309 filed on Nov. 20, 2008, and Japanese Patent Application No. JP 2009-230759 filed on Oct. 2, 2009, the contents of which are hereby incorporated by reference into this application.

TECHNICAL FIELD OF THE INVENTION

The present invention relates to a non-volatile semiconductor memory device and a fabrication technique of the same and, in particular, to a technology effectively applied to a non-volatile semiconductor memory device having a structure in which a charge storage film is interposed between a first potential barrier film and a second potential barrier film, and a fabrication technique of the non-volatile semiconductor memory device.

BACKGROUND OF THE INVENTION

Japanese Patent Laid-Open Publication No. 09-148325 discloses a technology of achieving a silicon oxynitride film excellent in uniformity of in-plane film thickness and in electrical characteristics. Specifically, a semiconductor wafer is heated to the temperature of about 1100° C. in an atmosphere containing oxygen gas to form a silicon oxide film having a predetermined film thickness on the semiconductor wafer. Then, with $NH_3$ gas introduced onto the semiconductor wafer heated to about 1000° C., the silicon oxide film is nitrided to form a silicon oxynitride film. Then, with the degree of vacuum kept under 25 Torr, the semiconductor wafer is kept at about 1100° C. and for 30 seconds for dehydrogenation of the silicon oxynitride film.

Japanese Patent Laid-Open Publication No. 06-209009 discloses a method of fabricating a semiconductor device including the steps of: nitriding a surface of a semiconductor substrate; forming a silicon oxide film on the nitrided semiconductor substrate; and forming a silicon oxynitride film by increasing the density of the silicon oxide film.

Japanese Patent Laid-Open Publication No. 06-291330 discloses a non-volatile semiconductor memory device. Specifically, the non-volatile semiconductor memory device has, as a first insulating film, a charge-injectable tunnel insulating film on a surface of a semiconductor substrate, the tunnel insulating film being formed of a tunnel silicon oxynitride film and a tunnel silicon oxide film provided on the tunnel silicon oxynitride film. The memory device further includes a gate insulating film having stacked thereon a silicon nitride film as a second insulating film and a silicon oxide film as a third insulating film, and also includes a gate electrode provided on this gate insulating film.

SUMMARY OF THE INVENTION

Typical conventional examples of non-volatile memory include MONOS-type (a semiconductor substrate, a silicon oxide film, a silicon nitride film, a silicon oxide film, and then a gate electrode) non-volatile memory having a structure of a silicon substrate (semiconductor substrate), a first potential barrier film (lower insulating layer), a charge storage film, and then a second potential barrier film (upper insulating film) and floating-gate-type (a semiconductor substrate, a silicon oxide film, a polysilicon film, a silicon oxide film, and a gate electrode) non-volatile memory. In general, a silicon oxide film is often used as the first potential barrier film (lower insulating layer) and the second potential barrier film (upper insulating layer). The first potential barrier film is referred to as a silicon tunnel oxide film, and the second potential barrier film is referred to as a silicon gate insulating film. Also, a silicon nitride film or a polysilicon film (polycrystalline silicon film) is used as a charge storage film. Here, the second potential barrier film formed on the charge storage film has a sufficient barrier height to prevent an influx of carriers from the gate electrode. In the non-volatile memory, data is written by injecting electrons from the semiconductor substrate through the first potential barrier film (silicon tunnel oxide film) into the silicon nitride film or the polysilicon film, with a positive voltage being applied to the gate electrode. In this structure of the non-volatile memory, leakage of electrons injected into the charge storage film can be suppressed with the first potential barrier film and the second potential barrier film having a sufficient barrier height. Therefore, excellent memory retention characteristics can be achieved.

Using a silicon oxide film as the first potential barrier film (lower insulating layer) improves the memory retention characteristics can be improved. It is known that the characteristics depend largely on the film quality of the silicon oxide film. Thus, a relation between the memory retention characteristics of the non-volatile memory and the film quality of the silicon oxide film as a first potential barrier film has been studied. In the following, a model is described in which the memory retention characteristics of the non-volatile memory deteriorate. That is, in this model, by charges injected from the semiconductor substrate through the first potential barrier film (silicon oxide film) into the charge storage film, trap levels are generated in the silicon oxide film as the first potential barrier film. This causes charges stored in the charge storage film to be leaked to the semiconductor substrate via the trap levels, thereby causing the memory retention characteristics of the non-volatile memory to deteriorate. To suppress deterioration of the memory retention characteristics, the trap levels in the first potential barrier film (silicon oxide film) have to be reduced, but no reduction method has yet been established, which poses a serious problem in fabricating non-volatile memories.

When a first potential barrier film is formed of a silicon oxide film, as a method of forming this silicon oxide film on a semiconductor substrate, there is a method called "hydrogen/oxygen method" (a method of keeping the semiconductor substrate at 1000° C. and for 50 seconds under a mixed atmosphere of hydrogen gas and oxygen gas). The silicon oxide film formed with this hydrogen/oxygen method has an advantage of high film quality with a relatively small number of trap levels formed in the silicon oxide film. However, the hydrogen/oxygen method has a problem that the film formation speed of the silicon oxide film is too slow to achieve a sufficient throughput. That is, in mass-production factories for fabricating non-volatile memories, ensuring a sufficient throughput is a matter of highest priority while an improvement in reliability of film quality is also required.

Thus, as a method of forming a silicon oxide film as a first potential barrier film, a plasma oxidation method using plasma is used. With this plasma oxidation method, since the film formation speed of the silicon oxide film is sufficiently high compared with the hydrogen/oxygen method, the throughput can be advantageously improved. That is, in the mass-production factories where an improvement in throughput is assigned the highest priority, a silicon oxide film as a first potential barrier film is formed with the plasma oxidation method, thereby ensuring an improvement in throughput. However, it is known that the silicon oxide film formed with the plasma oxidation method is inferior in film quality to the silicon oxide film formed with the hydrogen/oxygen method.

For this reason, in a non-volatile memory fabricating process, in view of the capability of improving throughput, on the premise that the plasma oxidation method is used to form a silicon oxide film as a first potential barrier film, there is a further need for taking some measures to enhance the film quality of the silicon oxide film.

A preferred aim of the present invention is to provide a technique capable of improving the memory retention characteristics of a non-volatile memory and, in particular, to provide a technique of fabricating a non-volatile semiconductor memory device capable of enhancing the film quality of a silicon oxide film even when the silicon oxide film as a first potential barrier film is formed with the plasma oxidation method to improve the memory retention characteristics of the non-volatile memory.

The above and other preferred aims and novel characteristics of the present invention will be apparent from the description of the present specification and the accompanying drawings.

The typical ones of the inventions disclosed in the present application will be briefly described as follows.

A non-volatile semiconductor memory device of a typical embodiment has a plurality of memory cells, each of the memory cells including: (a) a first potential barrier film formed on a semiconductor substrate; (b) a charge storage film formed on the first potential barrier film; (c) a second potential barrier film formed on the charge storage film; (d) a gate electrode formed on the second potential barrier film; and (e) a source region and a drain region formed in the semiconductor substrate aligned with the gate electrode. The first potential barrier film is formed of a stacked film of a silicon oxide film and a silicon oxynitride film formed on the silicon oxide film, and nitrogen atoms segregate at an interface between the first potential barrier film and the semiconductor substrate. And, the silicon oxide film configuring the first potential barrier film is formed through a plasma oxidation method using a source gas without containing hydrogen gas.

A method of fabricating a non-volatile semiconductor memory device, the method including the steps of:

(a) forming a first silicon oxide film on a semiconductor substrate by a plasma oxidation method using a source gas without containing hydrogen gas; (b) after the step (a), introducing nitrogen atoms onto a surface of the first silicon oxide film by plasma nitridation; (c) after the step (b), reacting the nitrogen atoms introduced onto the surface of the first silicon oxide film with the first silicon oxide film by a heat treatment of heating the semiconductor substrate in an atmosphere containing nitric oxide gas to form a silicon oxynitride film on the surface of the first silicon oxide film, and to segregate the nitrogen atoms to an interface between the first silicon oxide film and the semiconductor substrate; (d) after the step (c), forming a first conductive film on the silicon oxynitride film; (e) after the step (d), forming a second silicon oxide film on the first conductive film; (f) after the step (e), forming a second conductive film on the second silicon oxide film. And, the method of fabricating a non-volatile semiconductor memory device further includes the steps of: (g) sequentially processing the second conductive film, the second silicon oxide film, the first conductive film, the silicon oxynitride film, and the first silicon oxide film to form a gate electrode formed of the second conductive film, a second potential barrier film formed of the second silicon oxide film, a charge storage film formed of the first conductive film, and a first potential barrier film formed of the silicon oxynitride film and the first silicon oxide film; and (h) after the step (g), forming a source region and a drain region aligned with the gate electrode in the semiconductor substrate.

The effects obtained by typical aspects of the present invention will be briefly described below.

According to the present invention, the memory retention characteristics of the non-volatile memory can be improved. In particular, even when a silicon oxide film to be a first potential barrier film is formed with the plasma oxidation method, the film quality of the silicon oxide film can be enhanced to improve the memory retention characteristics of the non-volatile memory.

BRIEF DESCRIPTIONS OF THE DRAWINGS

Figure 14:
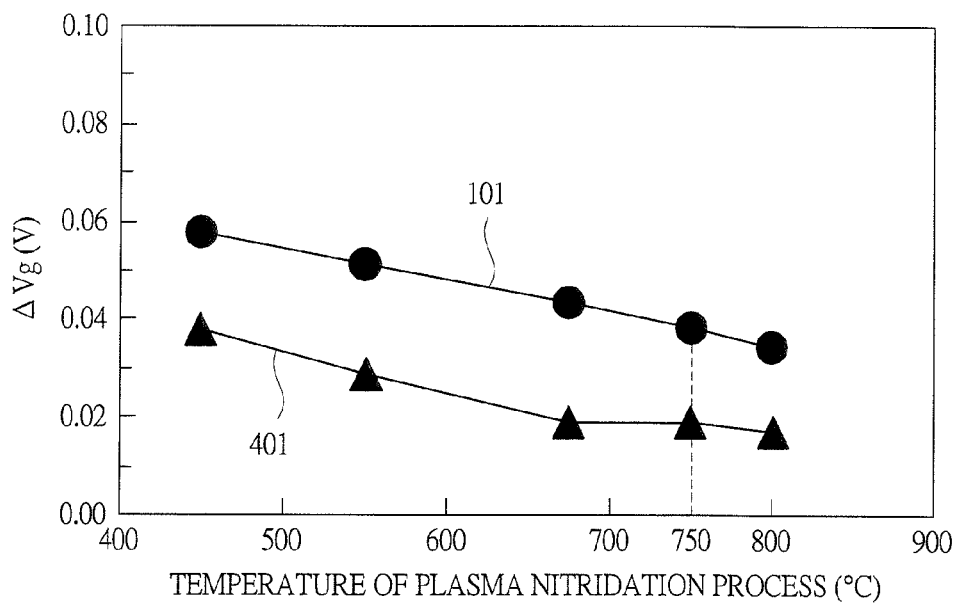
Figure 15:
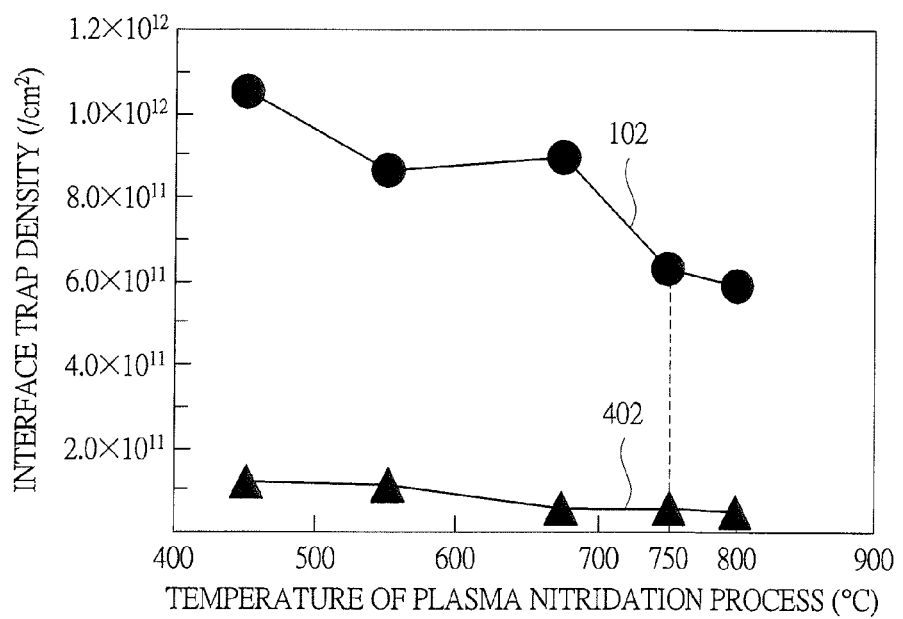

FIG. 14 is a graph depicting a correlation between a process temperature in plasma nitridation and a density of trap levels in a silicon oxide film to which a heat treatment has been performed in an atmosphere containing nitric oxide after plasma nitridation; and FIG. 15 is a graph depicting a correlation between a process temperature in plasma nitridation and a density of trap levels in an interface between a semiconductor substrate and the silicon oxide film (interface trap density) to which a heat treatment has been performed in an atmosphere containing nitric oxide after plasma nitridation.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments, and the repetitive description thereof is omitted. Note that, in some drawings used in the embodiments, hatching is used even in a plan view so as to make the drawings easy to see.

Figure 1:
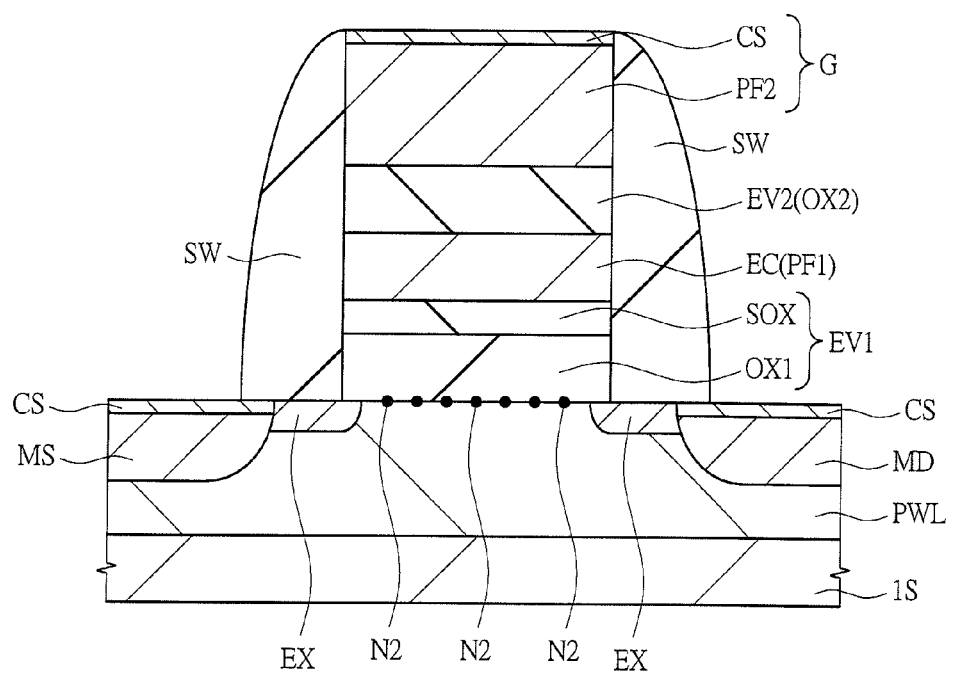
FIG. 1 is a cross-sectional view illustrating a structure of a non-volatile semiconductor memory device according to an embodiment of the present invention.

A non-volatile memory device of the present invention has a plurality of memory cells, and a structure of each of the memory cells is now described. FIG. 1 is a cross-sectional view of the structure of a memory cell according to an embodiment of the present invention. As illustrated in FIG. 1, a p-type well PWL formed of a p-type semiconductor region is formed on a semiconductor substrate 1S. On this p-type well PWL, the memory cell is formed. The p-type well PWL is a semiconductor region having p-type impurities, such as boron, introduced thereinto.

In the memory cell, a first potential barrier film EV1 is formed on the semiconductor substrate 1S (p-type well PWL). On the first potential barrier film EV1, a charge storage film EC is formed. The first potential barrier film EV1 functions as a tunnel insulating film, i.e., the memory cell stores or erases information by injecting electrons from the semiconductor substrate 1S via the first potential barrier film EV1 into the charge storage film EC or discharging electrons from the charge storage film EC to the semiconductor substrate 1S.

The charge storage film EC formed on the first potential barrier film EV1 has a charge storing function of storing electric charges. Specifically, in the present embodiment, the charge storage film EC is formed of a polysilicon film PF1. The memory cell in the present embodiment stores information by controlling a current flowing through the semiconductor substrate 1S under a gate electrode G based on the presence or absence of charge stored in the charge storage film EC. That is, information is stored by using a change in threshold voltage of the current flowing through the semiconductor substrate 1S under the gate electrode G based on the presence or absence of charges stored in the charge storage film EC.

On the charge storage film EC, a second potential barrier film EV2 is formed. The gate electrode G is formed on the second potential barrier film EV2. The second potential barrier film EV2 is formed of, for example, a silicon oxide film OX2, and functions as a barrier that suppresses injection of charges from the gate electrode G into the charge storage film EC. The gate electrode G is configured of, for example, a stacked film of a polysilicon film PF2 and a cobalt silicide film CS. The cobalt silicide film CS is formed to decrease resistance of the gate electrode G.

On both side walls of the first potential barrier film EV1, the charge storage film EC, the second potential barrier film EV2, and the gate electrode G, side walls SW formed of, for example, a silicon oxide film are formed. In the semiconductor substrate 1S immediately under the side walls SW, a pair of shallow low-concentration impurity diffusion regions EX, which are n-type semiconductor regions, is formed. In an outside region abutting on the pair of shallow low-concentration impurity diffusion regions EX, a pair of deep high-concentration impurity diffusion regions MS and MD is formed. These deep high-concentration impurity diffusion regions MS and MD are also n-type semiconductor regions. The cobalt silicide film CS is formed on a surface of each of the deep high-concentration impurity diffusion regions MS and MD. With the pair of shallow low-concentration impurity diffusion regions EX and the pair of deep high-concentration impurity diffusion regions MS and MD, a source region or a drain region of the memory cell is formed. With the source region and the drain region formed of the shallow low-concentration impurity diffusion regions EX and the deep high-concentration impurity diffusion regions MS and MD, the source region and the drain region can have a lightly doped drain (LDD) structure. In this manner, the memory cell according to the present embodiment is configured.

Next, a feature of the structure of the memory cell according to the present embodiment is described. A feature of the memory cell in the present embodiment resides in the structure of the first potential barrier film EV1. Specifically, in the present embodiment, the first potential barrier film EV1 is formed of the silicon oxide film OX1 and a silicon oxynitride film SOX formed on a surface of the silicon oxide film OX1, and has a structure in which nitrogen N2 is segregated to an interface between the first potential barrier film EV1 and the semiconductor substrate 1S.

In this manner, trap levels (defect levels) occurring on the silicon oxide film OX1, which is a main component of the first potential barrier film EV1, can be reduced. Specifically, the trap levels occurring near the surface of the silicon oxide film OX1 can be reduced by forming the silicon oxynitride film SOX. The trap levels formed in the interface between the silicon oxide film OX1 and the semiconductor substrate 1S can be reduced by segregating nitrogen N2 to cause the trap levels to be filled with nitrogen N2.

In the present embodiment, the trap levels in the first potential barrier film EV1 can be reduced. Improvement in the memory retention characteristics of the memory cell obtained with the trap levels being reduced is now described below. The memory cell has information stored therein by storing charges in the charge storage film EC formed on the first potential barrier film EV1. Therefore, in view of retaining the stored information, it is important to prevent the charges stored in the charge storage film EC from being leaked. To achieve this, the memory cell has a structure in which the charge storage film EC is interposed between the first potential barrier film EV1 and the second potential barrier film EV2 each serving as a barrier against discharge of charges.

When trap levels are present in the silicon oxide film OX1 forming the first potential barrier film EV1, a phenomenon occurs such that the charges stored in the charge storage film EC are leaked via the trap levels to the semiconductor substrate 1S. That is, when trap levels are present in the silicon oxide film OX1, the charges are leaked to the semiconductor substrate 1S via the trap levels serving as transit points. Therefore, as the more trap levels are formed in the silicon oxide film OX1, the more the charges stored in the charge storage film EC are leaked to the semiconductor substrate 1S via the trap levels. Leakage of a large amount of charges stored in the charge storage film EC to the semiconductor substrate 1S means a decrease in the amount of charges to be stored in the charge storage film EC, meaning that the stored information is lost. In this manner, when trap levels are present in the silicon oxide film OX1 forming the first potential barrier film EV1, the memory retention characteristics are deteriorated. In other words, if the trap levels being present in the silicon oxide film OX1 forming the first potential barrier film EV1 can be reduced, the memory retention characteristics of the memory cell can be improved.

Thus, in the present embodiment, the silicon oxynitride film SOX is formed on the surface of the silicon oxide film OX1 forming the first potential barrier film EV1, and nitrogen N2 is segregated to the interface between the silicon oxide film OX1 and the semiconductor substrate 1S. In this manner, by forming the silicon oxynitride film SOX, the trap levels formed at the surface of the silicon oxide film OX1 can be reduced as being filled with nitrogen atoms. Also, the trap levels formed at the interface between the silicon oxide film OX1 and the semiconductor substrate 1S can be reduced as being filled with nitrogen N2 (nitrogen atoms) segregated to the interface. Therefore, the trap levels being present in the silicon oxide film OX1 forming the first potential barrier film EV1 can be suppressed. As a result, the memory retention characteristics of the memory cell can be improved.

Since the trap levels of the silicon oxide film OX1 can be reduced by forming the silicon oxynitride film SOX on the surface of the silicon oxide film OX1, it can be considered that the trap levels in the first potential barrier film EV1 can be reduced by replacing the entire silicon oxide film OX1 with the silicon oxynitride film SOX. However, the height of the barrier of the silicon oxynitride film SOX is characteristically lower than the height of the barrier of the silicon oxide film OX1. This means that the height of the barrier is low when the first potential barrier film EV1 is formed of not the silicon oxide film OX1 but the silicon oxynitride film SOX, meaning that electrons are prone to be leaked from the charge storage film EC to the semiconductor substrate 1S. That is, when the first potential barrier film EV1 is configured of not the silicon oxide film OX1 but the silicon oxynitride film SOX, the height of the barrier of the first potential barrier film EV1 is decreased, resulting in deterioration of the memory retention characteristics of the memory cell.

As described above, in view of increasing the height of the barrier, using the silicon oxide film OX1 as the first potential barrier film EV1 is preferable. Therefore, as the first potential barrier film EV1, the silicon oxide film OX1 is used instead of the silicon oxynitride film SOX in the present embodiment. Also, if the trap levels being present in the silicon oxide film OX1 can be suppressed, the memory retention characteristics of the memory cell can be further improved. In view of this, in the present embodiment, the silicon oxynitride film SOX is formed on the surface of the silicon oxide film OX1 forming the first potential barrier film EV1, and also nitrogen N2 is segregated to the interface between the silicon oxide film OX1 and the semiconductor substrate 1S. That is, requirements for the first potential barrier film EV1 to improve the memory retention characteristics of the memory cell include, first, a sufficiently-high height of the barrier and, second, the capability of suppressing the trap levels. Thus, in the present embodiment, for the purpose of suppressing the trap levels while a high-barrier silicon oxide film OX1 is used, the silicon oxynitride film SOX is formed on the surface of the silicon oxide film OX1, and nitrogen N2 is segregated to the interface between the silicon oxide film OX1 and the semiconductor substrate 1S.

Note that, by segregating nitrogen N2 to the interface between the silicon oxide film OX1 and the semiconductor substrate 1S, the trap levels formed to the interface between the silicon oxide film OX1 and the semiconductor substrate 1S can be suppressed. When the amount of segregated nitrogen N2 is too large, the influence of positive fixed charges due to this nitrogen N2 is increased, the threshold voltage of the memory cell is varied, and control over an operation voltage of the memory cell becomes difficult. Therefore, the amount of nitrogen N2 to be segregated to the interface between the silicon oxide film OX1 and the semiconductor substrate 1S is preferably within a range of 3% to 7% with respect to the number of atoms of the first surface layer of silicon forming the semiconductor substrate 1S. In other words, the density of nitrogen N2 is preferably greater than or equal to 3% and smaller than or equal to 7% with respect to the surface density of silicon forming the semiconductor substrate 1S.

The memory cell according to the present embodiment is configured as described above. In the following, the operation of the memory cell is described. As basic operations of the memory cell, three operations, that is, (1) write, (2) delete, and (3) read will be described. Note herein that an operation for increasing charges in the charge storage film is referred to a write operation, and an operation for decreasing charges in the same is referred to an erase operation.

(1) At the time of a write operation, in FIG. 1, a potential difference is provided between the source region and the drain region. In this state, a high gate overdrive voltage is applied to the gate electrode G. In this manner, a channel region is formed near the surface of the p-type well PWL under the gate electrode G. Under this voltage condition, a strong electric field is generated in the channel region under the gate electrode G, generating a lot of hot electrons. Then, a write operation is performed by injecting part of the hot electrons into the polysilicon film PF1 being the charge storage film EC via the first potential barrier film EV1.

(2) At the time of an erase operation, a negative potential is provided to the gate electrode G, and a positive potential is provided to the source region. In this manner, by generating strong inversion in a region where the gate electrode G and the source region overlaps each other at an end of the source region, band-to-band tunneling occurs, thereby generating holes. In this memory cell, an erase operation is performed by attracting the generated holes by a bias voltage (negative voltage) applied to the gate electrode G and injecting them into the polysilicon film PF1 being the charge storage film EC. That is, erase is performed by injecting the holes to decrease the threshold of the gate electrode G, which has been increased by injecting the hot electrons.

(3) At the time of a read operation, an appropriate gate potential that can distinguish a threshold difference of the gate electrode G provided according to a write/erase state is applied. In this manner, in a write state, a channel is formed in the surface of the p-type well PWL under the gate electrode G to cause an electric current to flow. On the other hand, in an erase state, no channel is formed in the surface of the p-type well PWL under the gate electrode G, thereby causing an electric current to hardly flow. Thus, based on the amount of electric current flowing through the channel, it is possible to distinguish between a write state and an erase state of the memory cell.

Alternatively, a read operation can be performed in the following manner. For example, in the memory cell in the present embodiment, a voltage is applied to the gate voltage G to form a channel adjacent to the surface of the semiconductor substrate is, and a current Id flowing between the source region and the drain region is measured. This current Id depends on a voltage Vg to be applied to the gate electrode G. Whether the memory cell is in a write state or an erase state is defined by a value of the voltage Vg providing a predefined current Id. That is, when the voltage Vg to be applied to the gate electrode G to make the predefined electric current Id flow is increased (when the threshold is increased), the state can be determined as a write state. On the other hand, when the voltage Vg to be applied to the gate electrode G to make the predefined electric current Id flow is decreased (when the threshold is decreased), the state can be determined as an erase state. A read operation can be performed also in the above-described manner.

Figure 2:
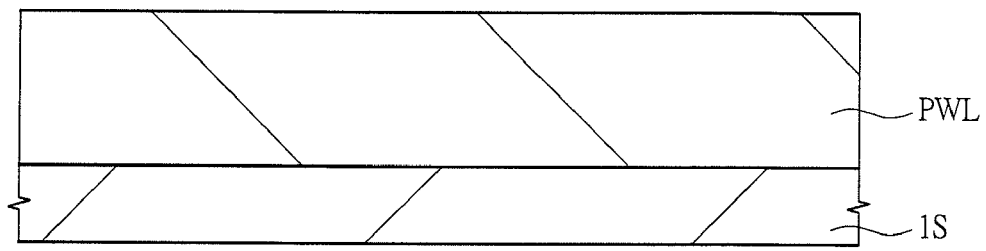
FIG. 2 is a cross-sectional view illustrating a process of fabricating the non-volatile semiconductor memory device according to the present embodiment.

Next, a method of fabricating the non-volatile semiconductor memory device according to the present embodiment is described with reference to FIGS. 2 to 7. First, as illustrated in FIG. 2, the semiconductor substrate 1S formed of single crystal silicon to which p-type impurities, such as boron (B), are introduced is prepared. At this time, the semiconductor substrate 1S is in a state of a semiconductor wafer having a substantially disk shape. Then, an isolation region is formed on the semiconductor substrate 1S (not shown in FIGS. 2 to 7). The isolation region is provided so that devices do not interfere with each other. This isolation region can be formed by using, for example, local oxidation of silicon (LOCOS) or shallow trench isolation (STI). For example, in the STI, the isolation region is formed in the following manner. That is, an isolation trench is formed in the semiconductor substrate 1S by using photolithography and etching. Then, a silicon oxide film is formed on the semiconductor substrate 1S so as to be buried in the isolation trench. Then, by chemical mechanical polishing (CMP), an unnecessary portion of the silicon oxide film formed on the semiconductor substrate 1S is removed. In this manner, an isolation region by the silicon oxide film buried only in the isolation trench can be formed.

Next, a p-type well PWL is formed by introducing impurities into the semiconductor substrate 1S. The p-type well PWL is formed by introducing p-type impurities, for example, boron, into the semiconductor substrate 1S by ion implantation.

Figure 3:
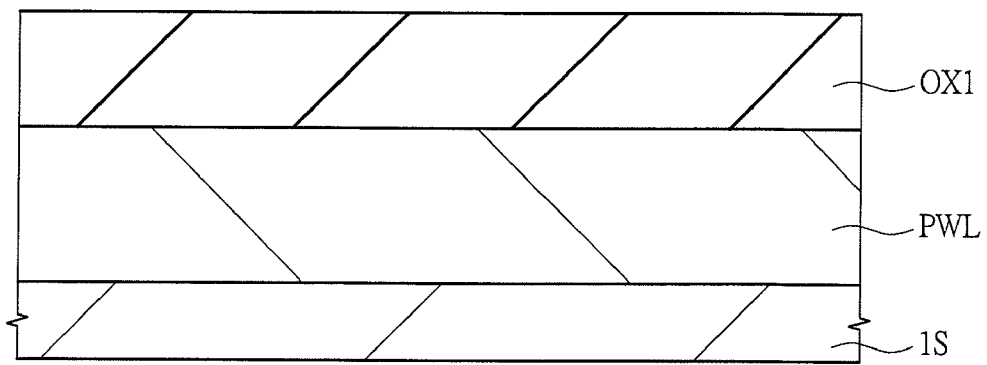
FIG. 3 is a cross-sectional view illustrating the process of fabricating the non-volatile semiconductor memory device according to the present embodiment continued from FIG. 2.

Next, as illustrated in FIG. 3, on the semiconductor substrate 1S (p-type well PWL), a silicon oxide film OX1 having a film thickness of, for example, about 7 nm, is formed. In the present embodiment, the silicon oxide film OX1 is formed with a plasma oxidation method using a source gas without containing hydrogen gas ($H_2$).

In general, the silicon oxide film OX1 is formed with, for example, the hydrogen/oxygen method (a method of keeping the semiconductor substrate 1S at 1000° C. and for 50 seconds under a mixed atmosphere of hydrogen gas and oxygen gas). This is because the silicon oxide film OX1 having small trap levels and high film quality can be formed with the hydrogen/oxygen method. However, the hydrogen/oxygen method has a problem that the film formation speed of the silicon oxide film OX1 is too slow to achieve a sufficient throughput. That is, in mass-production factories for fabricating non-volatile semiconductor memory devices, ensuring a sufficient throughput is a matter of highest priority while an improvement in reliability of film quality is required.

Moreover, in the hydrogen/oxygen method, hydrogen gas ($H_2$) is used. This also poses a problem that hydrogen is introduced into the silicon oxide film OX1. When hydrogen is introduced into the silicon oxide film OX1, the introduced hydrogen in the silicon oxide film OX1 is diffused to various regions through various processes, which may cause deterioration in the characteristics of the non-volatile semiconductor memory device. For example, after a non-volatile semiconductor memory device is fabricated, if introduced hydrogen in the silicon oxide film OX1 is diffused into the charge storage film, electrons (negative charges) stored in the charge storage film and hydrogen ions (positive charges) are coupled together. This decreases the number of electrons stored in the charge storage film. Therefore, even when the memory is in a write state, it is feared to be erroneously determined as an erase state, in a read operation.

To get around this problem, in the present embodiment, as a method of forming the silicon oxide film OX1, a plasma oxidation method using a hydrogen-free source gas is used. That is, plasma film formation is performed under a non-hydrogen atmosphere by using a source gas having no hydrogen added. With this plasma oxidation method, the film formation speed of the silicon oxide film OX1 is sufficiently fast compared with that of the hydrogen/oxygen method, thereby advantageously improving throughput. That is, in the mass-production factories where an improvement in throughput is assigned the highest priority, an improvement in throughput can be ensured by forming the silicon oxide film OX1 with the plasma oxidation method.

Furthermore, since hydrogen gas is not used for the plasma source gas, it is possible to suppress introduction of hydrogen into the silicon oxide film OX1. Therefore, it is possible to suppress deterioration in characteristics of the non-volatile semiconductor memory device due to diffusion of hydrogen contained in the silicon oxide film OX1. For example, in the plasma oxidation method according to the present embodiment, the silicon oxide film OX1 can be formed by plasma containing silane ($SiH_4$) and nitric oxide (NO). Here, since silane contains hydrogen, hydrogen may seem to be introduced also into the silicon oxide film OX1 generated. However, in the plasma oxidation method, hydrogen is hardly introduced into the silicon oxide film OX1. It is when hydrogen gas ($H_2$) is used that a significant amount of hydrogen is introduced into the silicon oxide film OX1. By contrast, since hydrogen gas is not used in the present embodiment, hydrogen can be hardly introduced into the silicon oxide film OX1. Still further, in the plasma oxidation method according to the present embodiment, the silicon oxide film OX1 can be formed by using only oxygen plasma.

In this manner, the plasma oxidation method using a hydrogen-free source gas (hydrogen-free plasma oxidation method) is used in the present embodiment as a method of forming the silicon oxide film OX1. Another method of forming silicon oxide film OX1 is a hydrogen-free thermal oxidation method. Now, differences among the hydrogen-free plasma oxidation method, the hydrogen/oxygen method, and the hydrogen-free thermal oxidation method are described, specifically in view of the film formation speed (throughput) of the silicon oxide film OX1.

First, features of the hydrogen-free thermal oxidation method are described. In the hydrogen-free thermal oxidation method, the silicon oxide film OX1 is formed through a heat treatment using oxygen gas without containing hydrogen. Here, since oxygen gas is not sufficiently dissolved through a heat treatment, a diffusion rate of oxygen in silicon (semiconductor substrate 1S) is low. This means that the forming speed (throughput) of the silicon oxide film OX1 to be formed on silicon (semiconductor substrate 1S) is low. In particular, among the hydrogen-free plasma oxidation method, the hydrogen/oxygen method, and the hydrogen-free thermal oxidation method, the hydrogen-free thermal oxidation method is the slowest in the film formation speed (throughput) of the silicon oxide film.

Next, features of the hydrogen/oxygen method are described. In the hydrogen/oxygen method, the silicon oxide film OX1 is formed on silicon (semiconductor substrate 1S) by utilizing a thermal reaction between oxygen and hydrogen. Specifically, through a thermal treatment, hydrogen and oxygen react to form OH (hydroxyl). This OH (hydroxyl) has a property of a higher diffusion rate in silicon than that of oxygen ($O_2$). Therefore, with the hydrogen/oxygen method, oxidation of silicon with OH (hydroxyl) tends to proceed quickly, and the film formation speed (throughput) of the silicon oxide film OX1 is increased, compared with the hydrogen-free thermal oxidation method.

Next, features of the hydrogen-free plasma oxidation method are described. In the hydrogen-free plasma oxidation method, source gas containing oxygen is activated with plasma energy to form the silicon oxide film OX1. That is, with plasma energy, oxygen contained in the source gas becomes an oxygen radical. This oxygen radical has a property of a high diffusion rate in silicon (semiconductor substrate 1S). For this reason, in the hydrogen-free plasma oxidation method, an oxygen radical having a high diffusion rate is formed, and therefore the film formation speed (throughput) of the silicon oxide film OX1 is significantly increased. In particular, in the hydrogen-free plasma oxidation method, the film formation speed (throughput) of the silicon oxide film OX1 is high, compared with the hydrogen-free thermal oxidation method and the hydrogen/oxygen method. As evident from above, in view of an improvement in throughput by increasing the forming speed of the silicon oxide film OX1, the hydrogen-free plasma oxidation method is superior to the hydrogen/oxygen method and the hydrogen-free thermal oxidation method.

On the other hand, it is known that the silicon oxide film OX1 formed with the plasma oxidation method is inferior in film quality to the silicon oxide film OX1 formed with the hydrogen/oxygen method. The inferiority in film quality of the silicon oxide film OX1 means increased trap levels formed in the silicon oxide film OX1.

Thus, in the process of fabricating the non-volatile semiconductor memory device according to the present embodiment, in view of the capability of improving throughput, on the premise that the plasma oxidation method is used to form the silicon oxide film OX1, there is a further need for taking some measures to enhance the film quality (to mitigate the amount of formation of trap levels) of the silicon oxide film OX1.

In the following, a process for reducing trap levels formed in the silicon oxide film OX1 formed with the plasma oxidation method is described.

Figure 4:
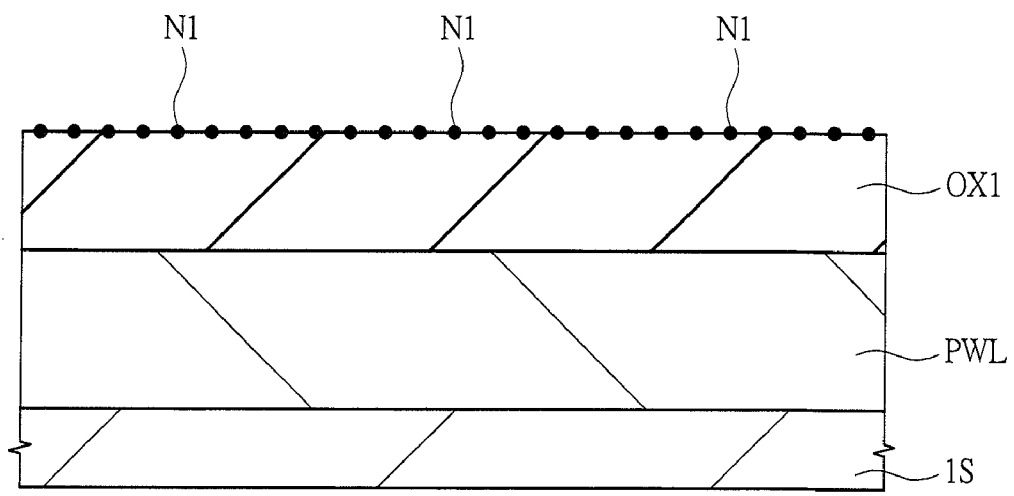
FIG. 4 is a cross-sectional view illustrating the process of fabricating the non-volatile semiconductor memory device according to the present embodiment continued from FIG. 3.

As illustrated in FIG. 4, plasma nitridation is performed on the silicon oxide film OX1. With this plasma nitridation, nitrogen N1 can be introduced onto the surface of the silicon oxide film OX1. At this time, plasma nitridation is performed with the semiconductor substrate 1S being heated at a relatively high temperature. Specifically, plasma nitridation is performed with the semiconductor substrate 1S being heated at a temperature higher than or equal to 750° C.

Plasma nitridation is performed at such a high temperature as described above due to the following reasons. A first reason is that nitrogen N1 is not introduced onto the surface of the silicon oxide film OX1 unless the semiconductor substrate 1S is heated at a high temperature. That is, the semiconductor substrate 1S is heated at a temperature higher than or equal to 750° C. in order to efficiently introduce nitrogen N1 onto the surface of the silicon oxide film OX1 through plasma nitridation.

A second reason is that damages are left more on the silicon oxide film OX1 when plasma nitridation is performed with the semiconductor substrate 1S being at a low temperature than when plasma nitridation is performed with the semiconductor substrate 1S being at a high temperature. Here, the damages onto the silicon oxide film OX1 mean formation of trap levels in the silicon oxide film OX1. Although ions and radicals configuring plasma bombard the surface of the silicon oxide film OX1 to form trap levels in either plasma nitridation at a low or high temperature, if the semiconductor substrate 1S is being heated at a high temperature, a recovering process of recovering the trap levels proceeds more (annealing effect). Therefore, in the present embodiment, plasma nitridation is performed with the semiconductor substrate 1S being heated at a relatively high temperature.

While nitrogen N1 is introduced onto the surface of the silicon oxide film OX1 by this plasma nitridation, this nitrogen N1 is in a state close to a silicon nitride film. It means that, at this stage, a lot of trap levels are present on the surface of the silicon oxide film OX1. That is, a strain occurs inside the silicon nitride film formed on the silicon oxide film OX1, forming trap levels because the bond between silicon and nitrogen is cut or bent. For this reason, the trap levels formed on the surface of the silicon oxide film OX1 cannot be reduced only by introducing nitrogen N1 onto the surface of the silicon oxide film OX1 through plasma nitridation.

Plasma nitridation to be performed in the present embodiment is to introduce nitrogen N1 onto the surface of the silicon oxide film OX1. To reduce the trap levels formed on the silicon oxide film OX1, the following processes have to be performed. Note that, according to an interpretation, the phenomenon in which nitrogen N1 is introduced only onto the surface of the silicon oxide film OX1 in plasma nitridation is due to relatively small nitrogen energy in plasma.

Figure 5:
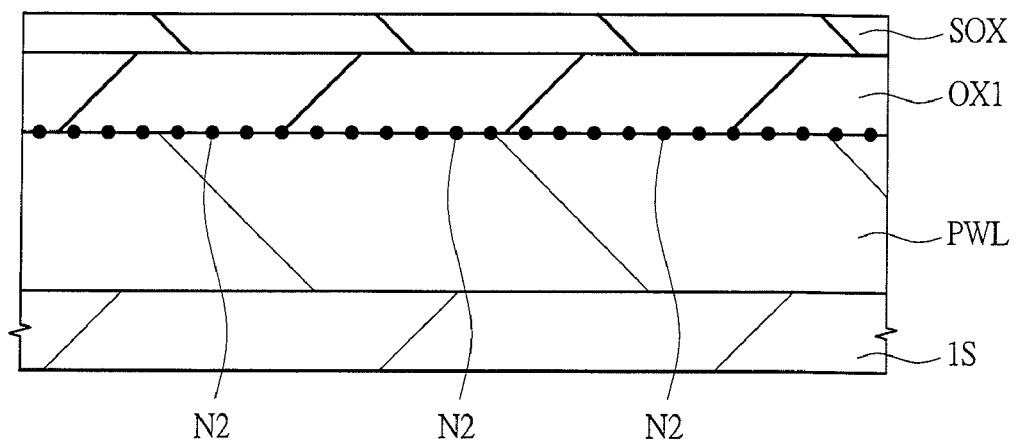
FIG. 5 is a cross-sectional view illustrating the process of fabricating the non-volatile semiconductor memory device according to the present embodiment continued from FIG. 4.

Next, as illustrated in FIG. 5, a heat treatment is performed, in which the semiconductor substrate 1S is kept at 950° C. and for 180 seconds under an atmosphere of 100% nitric oxide (NO). In this manner, nitrogen N2 is introduced to the interface between the silicon oxide film OX1 and the semiconductor substrate 1S and also, as nitrogen introduced onto the surface of the silicon oxide film OX1 reacts with the silicon oxide film OX1, the silicon oxynitride film SOX is formed. In this heat treatment in the nitric oxide atmosphere, a phenomenon occurs in which nitrogen N2 passes through the inside of the silicon oxide film OX1 to be segregated to the interface between the semiconductor substrate 1S and the silicon oxide film OX1. Also, a phenomenon occurs in which nitrogen introduced onto the surface of the silicon oxide film OX1 through plasma nitridation reacts with the silicon oxide film OX1 by the heat treatment at such a high temperature as 950° C. to form a silicon oxynitride film. In particular, by performing the heat treatment under a nitric-oxide-gas atmosphere, the phenomenon in which nitrogen N2 is segregated to the interface between the semiconductor substrate 1S and the silicon oxide film OX1 noticeably occurs.

In this manner, the silicon oxynitride film SOX can be formed on the surface of the silicon oxide film OX1, and also nitrogen N2 can be segregated to the interface between the silicon oxide film OX1 and the semiconductor substrate 1S. Therefore, the trap levels formed on the surface of the silicon oxide film OX1 can be reduced by being filled with nitrogen atoms with the formation of the silicon oxynitride film SOX. Also, the trap levels formed in the interface between the silicon oxide film OX1 and the semiconductor substrate 1S can be reduced by being filled with nitrogen N2 (nitrogen atoms) segregated to the interface. Consequently, the trap levels being present in the silicon oxide film OX1 can be suppressed.

In plasma nitridation, nitrogen N1 is introduced onto the surface of the silicon oxide film OX1 in a state close to a silicon nitride film. The nitrogen N1 introduced in the state close to a silicon nitride film can be made into the silicon oxynitride film SOX with a heat treatment in the atmosphere containing nitric oxide. With this silicon oxynitride film, distortion occurring inside the silicon nitride film can be decreased, and the trap levels can be reduced with oxygen buried in damaged bonds formed between nitrogen and silicon. Thereby, the trap levels formed in the surface of the silicon oxide film OX1 can be reduced by forming the silicon oxynitride film SOX.

Furthermore, while a lot of trap levels are present also in the interface between the silicon oxide film OX1 and the semiconductor substrate 1S, the trap levels formed in the interface between the silicon oxide film OX1 and the semiconductor substrate 1S are filled with nitrogen N2 by the heat treatment in the atmosphere containing nitric oxide, and therefore the trap levels in the interface between the silicon oxide film OX1 and the semiconductor substrate 1S can be reduced.

As described above, by combining plasma nitridation and the heat treatment in the atmosphere containing nitric oxide, the silicon oxynitride film SOX can be formed on the surface of the silicon oxide film OX1. Also, nitrogen N2 can be segregated to the interface between the silicon oxide film OX1 and the semiconductor substrate 1S. As a result, a significant effect of reducing the trap levels being present in the silicon oxide film OX1 can be achieved.

Here, although it has been described that the concentration of nitric oxide is 100%, the heating temperature of the semiconductor substrate 1S is 950° C., and the processing time is 180 seconds in the heat treatment in the atmosphere containing nitric oxide, the conditions are not limited to them. For example, the concentration of nitric oxide, the heating temperature of the semiconductor substrate 1S, and the processing time may be a combination of predetermined values so that the same amount of nitrogen N2 can be introduced into the interface between the semiconductor substrate 1S and the silicon oxide film OX1.

However, when the heating temperature of the semiconductor substrate 1S is lower than or equal to 950° C., it is difficult to introduce nitrogen N2 into the interface between the semiconductor substrate 1S and the silicon oxide film OX1. On the other hand, when the temperature of the semiconductor substrate 1S is higher than or equal to 1050° C., thermal degradation of the silicon oxide film OX1 itself proceeds. For this reason, the heating temperature of the semiconductor substrate 1S is desirably higher than or equal to 950° C. and lower than or equal to 1050° C.

Also, the concentration of nitric oxide may not be 100%. However, when nitric oxide of a low concentration is used, active gas affecting the film quality of the silicon oxide film OX1 cannot be used to dilute nitric oxide, and therefore inert gas, such as argon (Ar) or nitrogen, has to be used for dilution. Furthermore, in place of nitric oxide, another gas type may be used as long as the gas allows nitrogen N2 to be introduced into the interface between the semiconductor substrate 1S and the silicon oxide film OX1. However, gas containing hydrogen, such as ammonia, has a property of increasing trap levels in the silicon oxide film OX1, and therefore it is preferable to avoid such gas.

Figure 6:
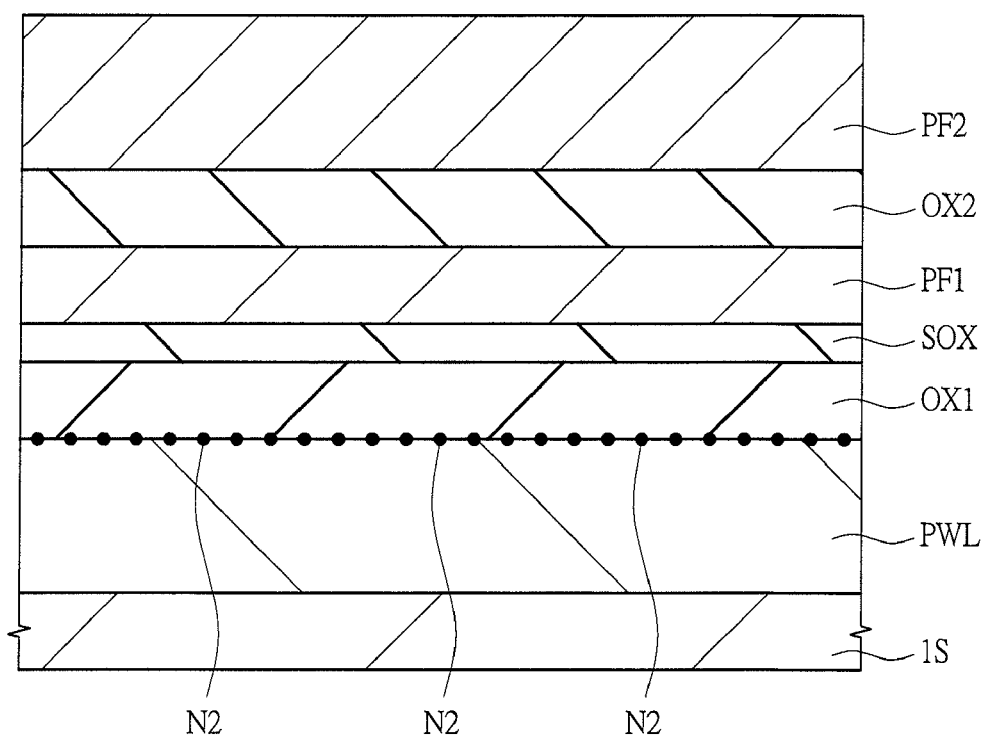
FIG. 6 is a cross-sectional view illustrating the process of fabricating the non-volatile semiconductor memory device according to the present embodiment continued from FIG. 5.

Next, as illustrated in FIG. 6, the polysilicon film PF1 is formed on the silicon oxynitride film SOX. The polysilicon film PF1 can be formed through chemical vapor deposition (CVD), in which, for example, the semiconductor substrate 1S is kept at 650° C. and for 60 seconds under a mono-silane ($SiH_4$) atmosphere. Alternatively, CVD using another source gas may be used. The film thickness of the polysilicon film PF1 is, for example, 3 nm to 6 nm.

Subsequently, the silicon oxide film OX2 is formed on the polysilicon film PF1. This silicon oxide film OX2 can be formed by using a technique in which the semiconductor substrate 1S is kept in a water-vapor atmosphere at 950° C. and for 60 seconds or, alternatively, using another technique. The film thickness of the silicon oxide film OX2 is, for example, 3 nm to 5 nm.

Then, the polysilicon film PF2 is formed on the silicon oxide film OX2. The polysilicon film PF2 is formed by using CVD, specifically, with the semiconductor substrate 1S being kept at 650° C. using mono-silane as a source material.

Figure 7:
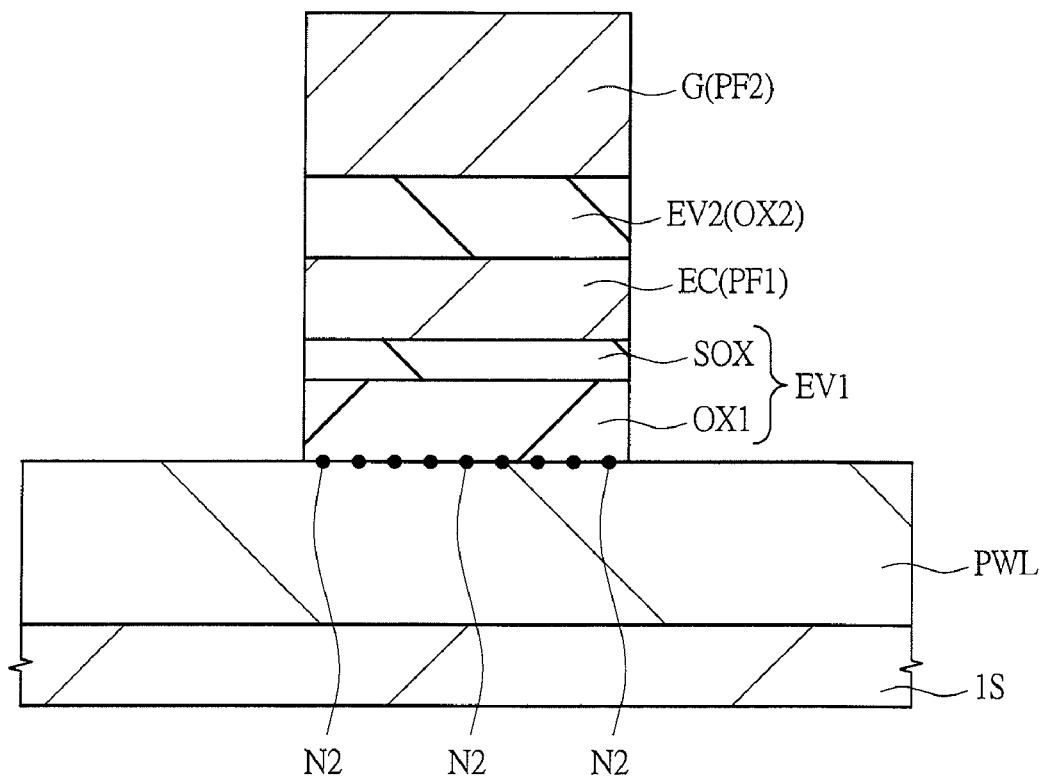
FIG. 7 is a cross-sectional view illustrating the process of fabricating the non-volatile semiconductor memory device according to the present embodiment continued from FIG. 6.

Then, as illustrated in FIG. 7, the polysilicon film PF2, the silicon oxide film OX2, the polysilicon film PF1, the silicon oxynitride film SOX, and the silicon oxide film OX1 are sequentially processed by using photolithography and etching techniques. In this manner, the gate electrode G formed of the polysilicon film PF2, the second potential barrier film EV2 formed of the silicon oxide film OX2, the charge storage film EC formed of the polysilicon film PF1, and the first potential barrier film EV1 formed of the silicon oxynitride film SOX and the silicon oxide film OX1 can be formed.

Next, as illustrated in FIG. 1, the shallow low-concentration impurity diffusion regions EX aligned with the gate electrode G are formed by using photolithography technique and ion implantation. The shallow low-concentration impurity diffusion regions EX are n-type semiconductor regions having n-type impurities introduced thereinto, such as phosphorus or arsenic.

Then, a silicon oxide film is formed on the semiconductor substrate 1S. The silicon oxide film can be formed by using, for example, CVD. Then, anisotropic etching is performed on the silicon oxide film to form the side walls SW. In this manner, the side walls SW are formed on both sides of the gate electrode G. Although these side walls SW are formed of a single-layer film of the silicon oxide film, this is not meant to be restrictive. For example, the side walls SW may be formed of, for example, a stacked film of a silicon nitride film and a silicon oxide film.

Then, the deep high-concentration impurity diffusion regions MS and MD aligned with the side walls SW are formed by using photolithography technique and ion implantation. The deep high-concentration impurity diffusion regions MS and MD are n-type semiconductor regions having n-type impurities introduced thereinto, such as phosphorus or arsenic. With these deep high-concentration impurities diffusion regions MS and MD and shallow low-concentration impurity diffusion regions EX, the source region or the drain region of the memory cell is formed. Thus, as the source region and the drain region are formed with the shallow low-concentration impurity diffusion regions EX and the deep high-concentration impurity diffusion regions MS and MD, the source region and the drain region can have a lightly doped drain (LDD) structure.

After the deep high-concentration impurity diffusion regions MS and MD are formed in the manner as described above, a heat treatment is performed at a temperature of about 1000° C. Consequently, the introduced impurities are activated.

Next, after a cobalt film is formed on the semiconductor substrate 1S, a heat treatment is performed, so that the polysilicon film PF2 configuring the gate electrode G reacts with the cobalt film to form the cobalt silicide film CS. In this manner, the gate electrode G has a stacked structure of the polysilicon film PF2 and the cobalt silicide film CS. Similarly, also on the surface of the deep high-concentration impurity diffusion regions MS and MD, silicon and the cobalt film react to form the cobalt silicide film CS.

Note that, while the cobalt silicide film CS is formed in the present embodiment, a nickel silicide film or a titanium silicide film may be formed in place of the cobalt silicide film CS. In the above-described manner, the non-volatile semiconductor memory device in the present embodiment can be fabricated.

According to the present embodiment, plasma nitridation at a high temperature and a heat treatment in an atmosphere containing nitric oxide are performed in combination, thereby forming the silicon oxynitride film SOX on the surface of the silicon oxide film OX1. Also, nitrogen N2 can be segregated to the interface between the silicon oxide film OX1 and the semiconductor substrate 1S. As a result, the trap levels being present in the silicon oxide film OX1 can be reduced, thereby achieving an improvement in the memory retention characteristics of the memory cell.

Figure 8:
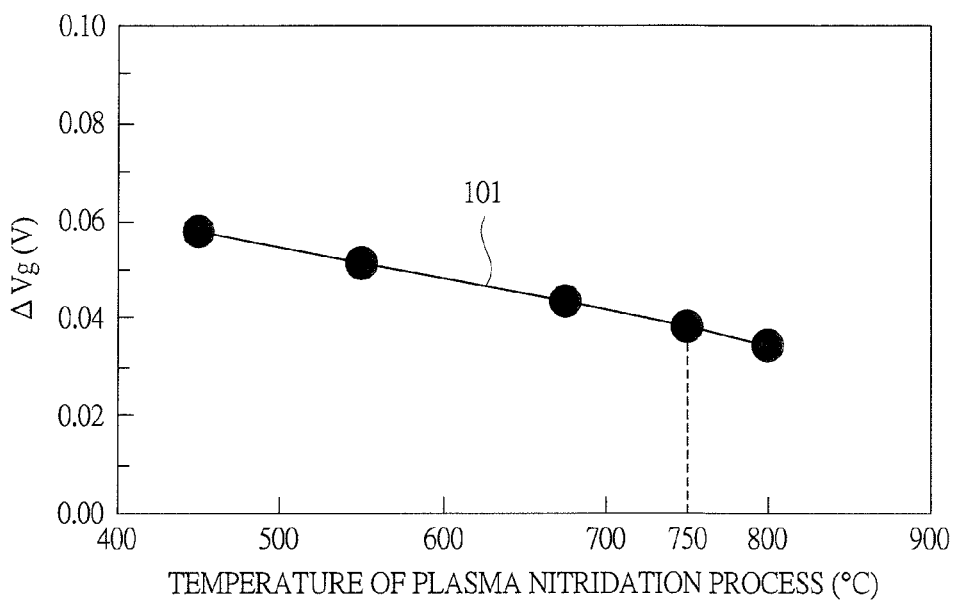
FIG. 8 is a graph depicting a correlation between a process temperature in plasma nitridation and a density of trap levels in a silicon oxide film.
Figure 9:
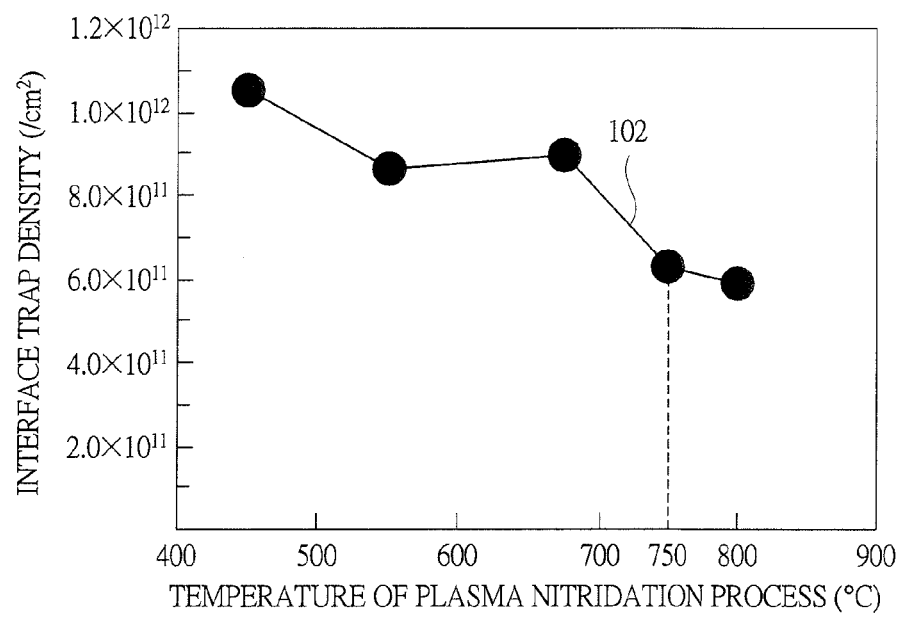
FIG. 9 is a graph depicting a correlation between a process temperature in plasma nitridation and a density of trap levels in an interface between a semiconductor substrate and the silicon oxide film (interface trap density)

In the following, studies on plasma nitridation are described. First, a relation between the process temperature in plasma nitridation and the density of trap levels is described. FIG. 8 is a graph depicting a correlation between a process temperature in plasma nitridation (temperature of the semiconductor substrate 1S) and a density of trap levels being present in the silicon oxide film OX1. FIG. 9 is a graph depicting a correlation between a process temperature in plasma nitridation (temperature of the semiconductor substrate 1S) and a density of trap levels being present in the interface between the semiconductor substrate 1S and the silicon oxide film OX1 (interface trap density).

In FIGS. 8 and 9, an aluminum electrode having a diameter of 300 μm is formed on the silicon oxide film OX1, a voltage in the negative direction is applied to this aluminum electrode, and then a voltage-value shift ΔVg and interface trap levels are measured with flowing a constant current of $5 \times 10^{-5}$ A/cm² through the silicon oxide film OX1 for 0.01 C/cm².

In FIG. 8, the voltage-value shift ΔVg is generated due to electrons stored in the silicon oxide film OX1, and corresponds to the density of trap levels in the silicon oxide film OX1. That is, when trap levels are formed in the silicon oxide film OX1, electrons are trapped into these trap levels. When these trapped electrons are present, the voltage-value shift ΔVg occurs. Specifically, for example, as the trap levels in the silicon oxide film OX1 are increased, the number of electrons to be trapped in these trap levels is increased, thereby increasing the voltage-value shift ΔVg due to these electrons. Therefore, as evident from the above, the density of trap levels in the silicon oxide film OX1 and the voltage-value shift ΔVg have a proportional relation.

With reference to FIG. 8, the voltage-value shift ΔVg is decreased as the process temperature for plasma nitridation is increased (curve 101). This indicates that, as the process temperature for plasma nitridation is increased, the density of trap levels being present in the silicon oxide film OX1 is decreased. Furthermore, also in FIG. 9, the interface trap density is decreased as the process temperature for plasma nitridation is increased (curve 102). In particular, the interface trap density is abruptly decreased as the process temperature for plasma nitridation becomes higher than or equal to 750° C. From this reason, in view of the capability of reduction of trap levels in the silicon oxide film OX1, plasma nitridation is preferably performed at a process temperature higher than or equal to 750° C. In particular, when the process temperature for plasma nitridation is higher than or equal to 750° C., the interface trap density can be lower than or equal to $8 \times 10^{11}$ (/cm²), as illustrated in FIG. 9. With the interface trap density being lower than or equal to $8 \times 10^{11}$ (/cm²), a leakage current can be sufficiently reduced.

As described above, the results of an experiment putting constant-current stress indicate that, the higher the process temperature for plasma nitridation is, the more the trap levels formed in the silicon oxide film OX1 can be suppressed. In this manner, the higher the process temperature for plasma nitridation is, the more the trap levels (the density of trap levels) formed in the silicon oxide film OX1 in plasma nitridation is reduced, because plasma damages (bombardment of ions and radicals) introduced into the silicon oxide film OX1 are recovered.

Figure 10:
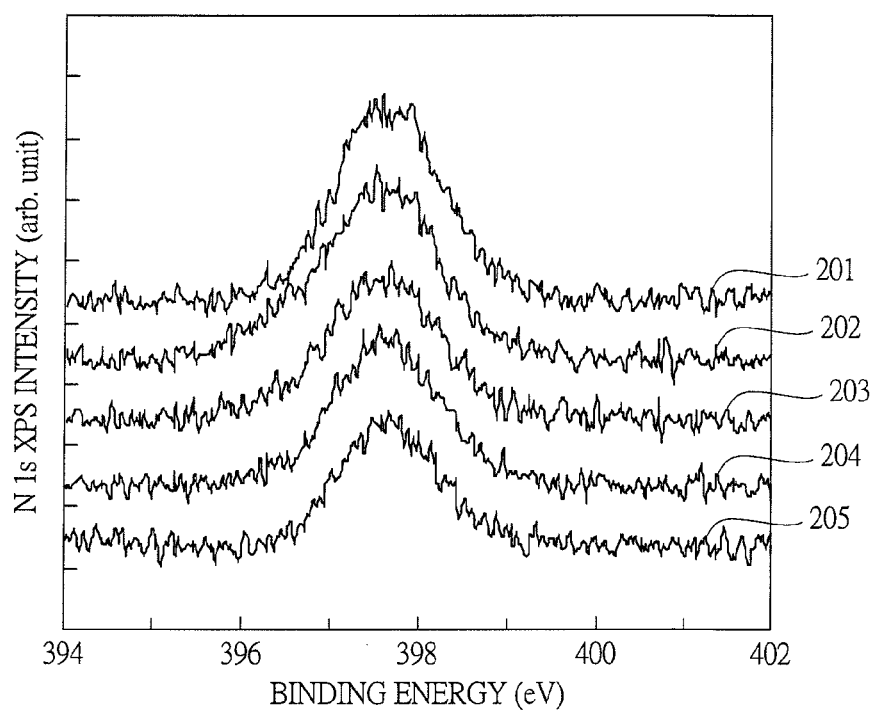
FIG. 10 is a graph depicting results of X-ray photoelectron spectroscopy (XPS) measuring electrons of nitrogen in the 1s orbital of a silicon oxide film having a film thickness of 7 nm to which plasma nitridation has been performed.
Figure 11:
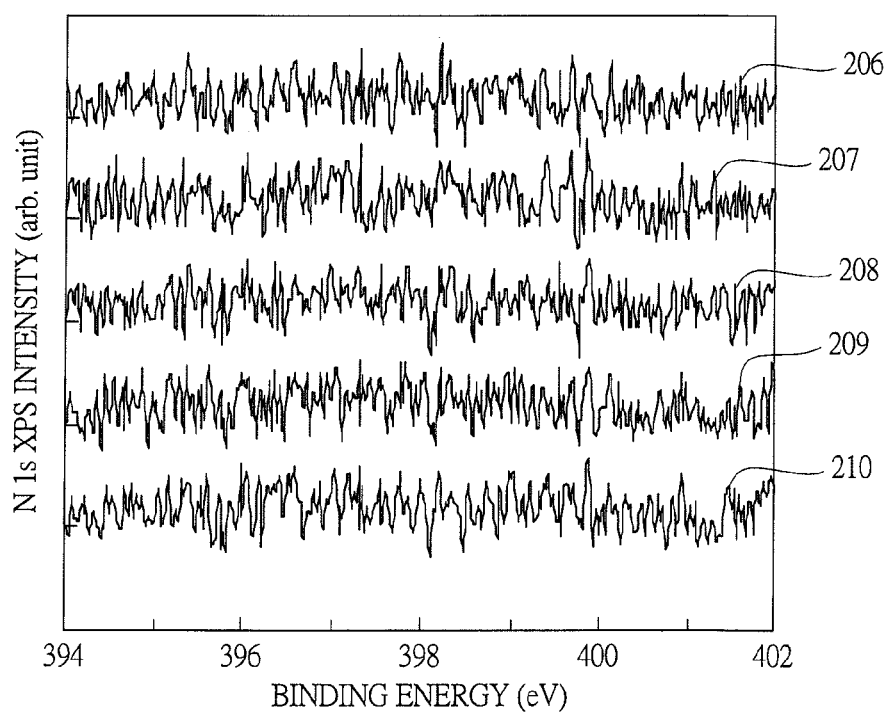
FIG. 11 is a graph depicting results of X-ray photoelectron spectroscopy (XPS) measuring electrons of nitrogen in the 1s orbital of a silicon oxide film having a film thickness of 2 nm by etching a silicon oxide film having a film thickness of 7 nm with hydrogen fluoride to which plasma nitridation has been performed.

Next, the results of investigating a chemical bonding state of nitrogen N1 introduced onto the surface of the silicon oxide film OX1 through plasma nitridation (refer to FIG. 4) are described. FIGS. 10 and 11 depict the results obtained by measuring electrons of nitrogen in the 1s orbital using X-ray photoelectron spectroscopy (XPS). FIG. 10 depicts the results of measurement with a silicon oxide film having a film thickness of 7 nm, and FIG. 11 depicts the results of measurement of a silicon oxide film having a film thickness of 2 nm made by etching a silicon oxide film having a film thickness of 7 nm with hydrogen fluoride. That is, in FIG. 11, the film having a film thickness of 7 nm was subjected to plasma nitridation, and was then etched so as to have a film thickness of 2 nm. The results correspond to those obtained by measuring a state inside the silicon oxide film having a film thickness of 7 nm.

Here, process temperatures for plasma nitridation were set to 450° C., 550° C., 675° C., 750° C., and 800° C. In FIG. 10, these process temperatures for plasma nitridation are represented by the curves 201 to 205. Similarly, in FIG. 11, these process temperatures are represented by the curves 206 to 210.

As illustrated in FIG. 10, in each of the curves 201 to 205, a peak is clearly observed in the XPS spectrum. From an energy value at that peak (binding energy value), nitrogen N1 is in a chemical bonding state similar to that of the silicon nitride film. On the other hand, as illustrated in FIG. 11, in each of the curves 206 to 210, a peak is not observed in the XPS spectrum. Here, in consideration of the fact that XPS provides information of only about 4 nm from the surface of the silicon oxide film, it is understood from FIGS. 10 and 11 that, in plasma nitridation, nitrogen N1 has been introduced only into a portion near the surface of the silicon oxide film OX1 and nitrogen N1 is in a chemical bonding state similar to that of the silicon nitride film.

Figure 12:
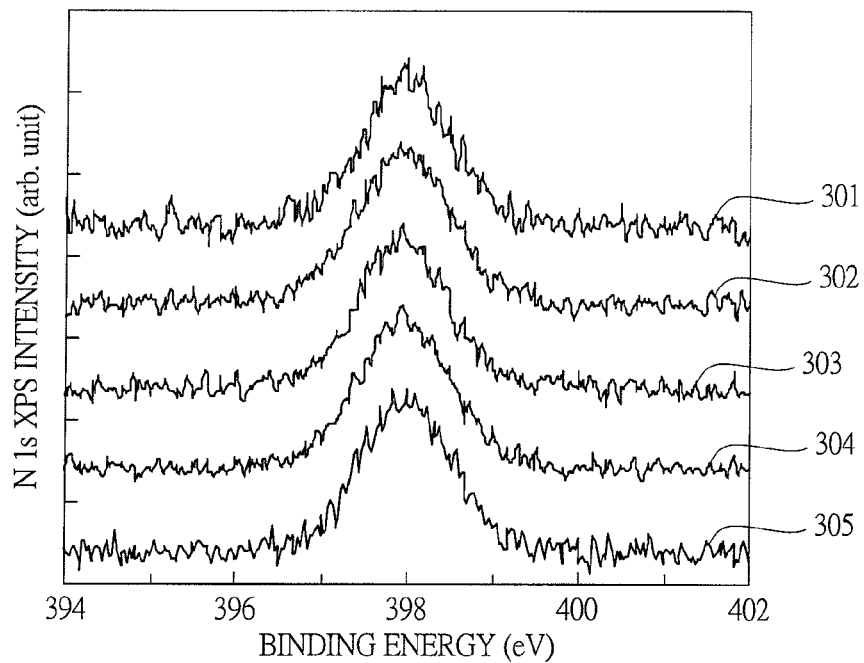
FIG. 12 is a graph depicting results of XPS measuring electrons of nitrogen in the 1s orbital of a silicon oxide film having a film thickness of 7 nm to which a heat treatment has been performed in an atmosphere containing nitric oxide after plasma nitridation.
Figure 13:
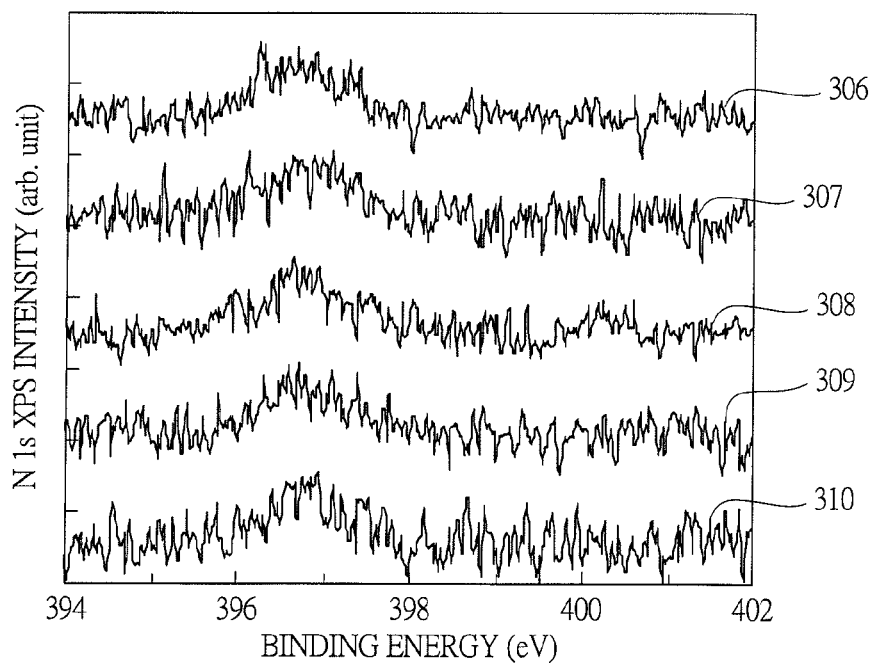
FIG. 13 is a graph depicting results of XPS measuring electrons of nitrogen in the 1s orbital of a silicon oxide film having a film thickness of 2 nm formed by etching a silicon oxide film having a film thickness of 7 nm with hydrogen fluoride to which a heat treatment has been performed in an atmosphere containing nitric oxide after plasma nitridation.

In the following, a study on the heat treatment in the atmosphere containing nitric oxide is described. First, after plasma nitridation, a heat treatment is performed in an atmosphere containing nitric oxide, and how the structure of the silicon oxide film OX1 is changed with this heat treatment is described below. FIGS. 12 and 13 depict results obtained by measuring electrons of nitrogen in the 1s orbital using XPS. FIG. 12 depicts the results of measurement with a silicon oxide film having a film thickness of 7 nm, and FIG. 13 depicts the results of a measurement of a silicon oxide film having a film thickness of 2 nm made by etching a silicon oxide film having a film thickness of 7 nm with hydrogen fluoride. That is, in FIG. 13, a film having a film thickness of 7 nm was subjected to a heat treatment in an atmosphere containing nitric oxide, and was then etched so as to have a film thickness of 2 nm. The results correspond to those obtained by measuring a state inside the silicon oxide film having a film thickness of 7 nm.

Here, process temperatures for the heat treatment in the atmosphere containing nitric oxide were set to 450° C., 550° C., 675° C., 750° C., and 800° C. In FIG. 12, these process temperatures for the heat treatment in the atmosphere containing nitric oxide are represented by the curves 301 to 305. Similarly, in FIG. 13, these process temperatures are represented by the curves 306 to 310.

As illustrated in FIG. 12, in each of the curves 301 to 305, a peak is clearly observed in the XPS spectrum, and it is understood that nitrogen N1 is present near the surface of the silicon oxide film OX1. However, an energy value at that peak (binding energy value) is different from that in each of the curves 201 to 205 depicted in FIG. 10. This means that, with the heat treatment in the atmosphere containing nitric oxide, nitrogen N1 reacts with the surrounding silicon oxide film OX1 to form the silicon oxynitride film SOX (refer to FIG. 5). On the other hand, as illustrated in FIG. 13, unlike the curves 206 to 210 depicted in FIG. 11, a peak is observed in the XPS spectrum in each of the curves 306 to 310. However, an energy value at that peak is different from any of those in the curves 201 to 205 depicted in FIG. 10 and the curves 301 to 305 depicted in FIG. 12. From this, the following can be understood. That is, with the heat treatment in the atmosphere containing nitric oxide, nitrogen N2 is introduced into the interface between the semiconductor substrate 1S and the silicon oxide film OX1. Also, from the energy value at that peak, this nitrogen N2 does not react with the silicon oxide film OX1 and is segregated to the interface between the semiconductor substrate 1S and the silicon oxide film OX1.

Next, to verify the effect of the heat treatment in the atmosphere containing nitric oxide, the density of trap levels in the silicon oxide film OX1 and the density of trap levels being present in the interface between the semiconductor substrate 1S and the silicon oxide film OX1 (interface trap density) were measured, and the results are described below.

FIG. 14 is a graph depicting a correlation between a process temperature in plasma nitridation (temperature of the semiconductor substrate 1S) and a density of trap levels present in the silicon oxide film OX1. In FIG. 14, the curve 401 indicates the results obtained by performing plasma nitridation on the silicon oxide film OX1 subsequently followed by the heat treatment in the atmosphere containing nitric oxide, and then performing measurements the same as those in the curve 101.

On the other hand, FIG. 15 is a graph depicting a correlation between a process temperature in plasma nitridation (temperature of the semiconductor substrate 1S) and a density of trap levels being present in the interface between the semiconductor substrate 1S and the silicon oxide film OX1 (interface trap density). In FIG. 15, the curve 402 indicates the results obtained by performing plasma nitridation on the silicon oxide film OX1, subsequently performing the heat treatment in the atmosphere containing nitric oxide, and then performing measurements the same as those in the curve 102.

With reference to FIGS. 14 and 15, as with the curves 101 and 102, in the curves 401 and 402, the higher the temperature of plasma nitridation is, the smaller the voltage-value shift ΔVg with respect to the density of trap levels in the film and the interface trap density tend to be. Further, in a comparison between the curves 101 and 102 and the curves 401 and 402, the values of the curves 401 and 402 are much smaller than the values of the curves 101 and 102.

The tendency described above indicates that the density of trap levels in the silicon oxide film OX1 and the interface trap density can both be significantly reduced by combining plasma nitridation and the heat treatment in the atmosphere containing nitric oxide. Here, the interface trap density is saturated at a significantly small value at temperatures higher than or equal to 750° C. of the process temperature of the plasma nitridation. From this, the process temperature for plasma nitridation is preferably higher than or equal to 750° C.

According to the present embodiment, by combining plasma nitridation at a high temperature and the heat treatment in the atmosphere containing nitric oxide, the silicon oxynitride film SOX can be formed on the surface of the silicon oxide film OX1 and also nitrogen N2 can be segregated to the interface between the silicon oxide film OX1 and the semiconductor substrate 1S. As a result, the trap levels in the silicon oxide film OX1 can be reduced to improve the charge storage capability of the memory cell, thereby improving the memory retention characteristics of the memory cell.

In the foregoing, the invention made by the inventor of the present invention has been concretely described based on the embodiments. However, it is needless to say that the present invention is not limited to the foregoing embodiments and various modifications and alterations can be made within the scope of the present invention.

In the above embodiment, a floating-gate-type non-volatile memory using a polysilicon film as a charge storage film has been described. However, it is not limited to this, and the present invention can also be applied to, for example, a MONOS-type non-volatile memory using a silicon nitride film as a charge storage film.

The present invention can be widely used in manufacturing industries for fabricating non-volatile semiconductor memory devices.

What is claimed is:

1. A method of fabricating a non-volatile semiconductor memory device, the method comprising the steps of:
   (a) forming a first silicon oxide film on a semiconductor substrate through a plasma film-forming method using a first source gas containing nitrogen and oxygen, and a second source gas containing silicon;
   (b) after the step (a), introducing nitrogen atoms onto a surface of the first silicon oxide film through plasma nitridation;
   (c) after the step (b), reacting the nitrogen atoms introduced onto the surface of the first silicon oxide film with the first silicon oxide film through a heat treatment of heating the semiconductor substrate in an atmosphere containing nitric oxide gas to form a silicon oxynitride film on the surface of the first silicon oxide film, and to segregate the nitrogen atoms to an interface between the first silicon oxide film and the semiconductor substrate;

(d) after the step (c), forming a first conductive film on the silicon oxynitride film;

(e) after the step (d), forming a second silicon oxide film on the first conductive film;

(f) after the step (e), forming a second conductive film on the second silicon oxide film;

(g) after the step (f), sequentially patterning the second conductive film, the second silicon oxide film, the first conductive film, the silicon oxynitride film, and the first silicon oxide film to form a gate electrode formed of the second conductive film, a second potential barrier film formed of the second silicon oxide film, a charge storage film formed of the first conductive film, and a first potential barrier film formed of the silicon oxynitride film and the first silicon oxide film; and (h) after the step (g), forming a source region and a drain region aligned with the gate electrode in the semiconductor substrate.

2. The method of fabricating the non-volatile semiconductor memory device according to claim 1, wherein
the plasma nitridation is performed with setting the semiconductor substrate at a temperature higher than or equal to 750° C.

3. The method of fabricating the non-volatile semiconductor memory device according to claim 1, wherein,
in the heat treatment of heating the semiconductor substrate in the atmosphere containing nitric oxide gas, the semiconductor substrate is heated at a temperature higher than or equal to 950° C. and lower than or equal to 1050° C.

4. The method of fabricating the non-volatile semiconductor memory device according to claim 1, wherein the first source gas comprises nitric oxide.

5. A method of fabricating a non-volatile semiconductor memory device, the method comprising the steps of:
(a) forming a first silicon oxide film on a semiconductor substrate through a plasma film-forming method using a first source gas containing nitrogen and oxygen, and a second source gas containing silicon;

(b) after the step (a), introducing nitrogen atoms onto a surface of the first silicon oxide film through plasma nitridation;

(c) after the step (b), reacting the nitrogen atoms introduced onto the surface of the first silicon oxide film with the first silicon oxide film through a heat treatment of heating the semiconductor substrate in an atmosphere containing nitric oxide gas to form a silicon oxynitride film on the surface of the first silicon oxide film, and to segregate the nitrogen atoms to an interface between the first silicon oxide film and the semiconductor substrate;

(d) after the step (c), forming a silicon nitride film on the silicon oxynitride film;

(e) after the step (d), forming a second silicon oxide film on the silicon nitride film;

(f) after the step (e), forming a conductive film on the second silicon oxide film;

(g) after the step (f), sequentially patterning the conductive film, the second silicon oxide film, the silicon nitride film, the silicon oxynitride film, and the first silicon oxide film to form a gate electrode formed of the conductive film, a second potential barrier film formed of the second silicon oxide film, a charge storage film formed of the silicon nitride film, and a first potential barrier film formed of the silicon oxynitride film and the first silicon oxide film; and (h) after the step (g), forming a source region and a drain region aligned with the gate electrode in the semiconductor substrate.

6. The method of fabricating the non-volatile semiconductor memory device according to claim 5, wherein
the plasma nitridation is performed with setting the semiconductor substrate at a temperature higher than or equal to 750° C.

7. The method of fabricating the non-volatile semiconductor memory device according to claim 5, wherein,
in the heat treatment of heating the semiconductor substrate in the atmosphere containing nitric oxide gas, the semiconductor substrate is heated at a temperature higher than or equal to 950° C. and lower than or equal to 1050° C.

8. The method of fabricating the non-volatile semiconductor memory device according to claim 5, wherein the first source gas comprises nitric oxide.

9. A method of fabricating a non-volatile semiconductor memory device, the method comprising the steps of:
(a) forming a first silicon oxide film on a semiconductor substrate through a plasma chemical vapor deposition (CVD) method using a first source gas containing nitrogen and oxygen, and a second source gas containing silicon;

(b) after the step (a), introducing nitrogen atoms onto a surface of the first silicon oxide film through plasma nitridation;

(c) after the step (b), reacting the nitrogen atoms introduced onto the surface of the first silicon oxide film with the first silicon oxide film through a heat treatment of heating the semiconductor substrate in an atmosphere containing nitric oxide gas to form a silicon oxynitride film on the surface of the first silicon oxide film, and to segregate the nitrogen atoms to an interface between the first silicon oxide film and the semiconductor substrate;

(d) after the step (c), forming a first conductive film on the silicon oxynitride film;

(e) after the step (d), forming a second silicon oxide film on the first conductive film;

(f) after the step (e), forming a second conductive film on the second silicon oxide film;

(g) after the step (f), sequentially patterning the second conductive film, the second silicon oxide film, the first conductive film, the silicon oxynitride film, and the first silicon oxide film to form a gate electrode formed of the second conductive film, a second potential barrier film formed of the second silicon oxide film, a charge storage film formed of the first conductive film, and a first potential barrier film formed of the silicon oxynitride film and the first silicon oxide film; and (h) after the step (g), forming a source region and a drain region aligned with the gate electrode in the semiconductor substrate.

10. The method of fabricating the non-volatile semiconductor memory device according to claim 9, wherein the first source gas comprises nitric oxide.

* * * * *